United States Patent
Chae et al.

(10) Patent No.: US 12,186,900 B2
(45) Date of Patent: Jan. 7, 2025

(54) SUBSTRATE CLEANING LINE AND SUBSTRATE CLEANING SYSTEM COMPRISING THE SAME

(71) Applicant: KCTECH CO., LTD., Gyeonggi-do (KR)

(72) Inventors: Hee Sung Chae, Gyeonggi-do (KR); Seung Eun Lee, Seoul (KR); Geun Sik Yun, Gyeonggi-do (KR)

(73) Assignee: KCTECH Co., Ltd. (KR)

( * ) Notice: Subject to any disclaimer, the term of this patent is extended or adjusted under 35 U.S.C. 154(b) by 0 days.

(21) Appl. No.: 17/671,259

(22) Filed: Feb. 14, 2022

(65) Prior Publication Data

US 2023/0065885 A1 Mar. 2, 2023

(30) Foreign Application Priority Data

Aug. 24, 2021 (KR) .................. 10-2021-0111944

(51) Int. Cl.
| | | |
|---|---|---|
| *B25J 9/04* | (2006.01) | |
| *B25J 11/00* | (2006.01) | |
| *B65G 61/00* | (2006.01) | |

(52) U.S. Cl.
CPC ........... *B25J 9/041* (2013.01); *B25J 11/0095* (2013.01); *B65G 61/00* (2013.01)

(58) Field of Classification Search
CPC ....... B25J 9/041; B25J 11/0095; B65G 61/00; H01L 21/67173; H01L 21/67178
See application file for complete search history.

(56) References Cited

U.S. PATENT DOCUMENTS

| | | | | |
|---|---|---|---|---|
| 5,876,280 A | * | 3/1999 | Kitano | H01L 21/67017 414/217 |
| 5,942,013 A | * | 8/1999 | Akimoto | H01L 21/67754 414/217 |
| 6,099,643 A | * | 8/2000 | Ohtani | H01L 21/67173 118/66 |
| 2006/0182535 A1 | * | 8/2006 | Rice | H01L 21/67173 414/217 |
| 2006/0182536 A1 | * | 8/2006 | Rice | H01L 21/67745 414/217 |
| 2007/0144439 A1 | * | 6/2007 | Englhardt | H01L 21/67742 156/345.31 |
| 2007/0147976 A1 | * | 6/2007 | Rice | H01L 21/67178 414/217 |
| 2007/0147982 A1 | * | 6/2007 | Rice | H01L 21/67742 414/800 |
| 2008/0014058 A1 | * | 1/2008 | Hongkham | H01L 21/67745 901/50 |
| 2008/0198342 A1 | * | 8/2008 | Fukutomi | H01L 21/67173 355/27 |
| 2009/0000543 A1 | * | 1/2009 | Fukutomi | H01L 21/67742 118/500 |

(Continued)

*Primary Examiner* — Saul Rodriguez
*Assistant Examiner* — Brendan P Tighe
(74) *Attorney, Agent, or Firm* — KDW Firm PLLC

(57) ABSTRACT

A substrate cleaning line and a substrate cleaning system including the same are disclosed. The substrate cleaning line may include a chamber portion including a plurality of cleaning chambers to clean a substrate, and a first return robot to load, unload, or transfer the substrate from or to the plurality of cleaning chambers, wherein the cleaning chambers may be stacked on each other in a vertical direction.

13 Claims, 4 Drawing Sheets

(56) References Cited

U.S. PATENT DOCUMENTS

| | | | |
|---|---|---|---|
| 2009/0013927 A1* | 1/2009 | Yamasaki | H01L 21/67742 118/500 |
| 2016/0126112 A1* | 5/2016 | Minamida | H01L 21/67173 134/94.1 |
| 2019/0341274 A1* | 11/2019 | Lee | H01L 21/67023 |

* cited by examiner

SUBSTRATE CLEANING LINE AND SUBSTRATE CLEANING SYSTEM COMPRISING THE SAME

CROSS-REFERENCE TO RELATED APPLICATION

This application claims the benefit of Korean Patent Application No. 10-2021-0111944 filed on Aug. 24, 2021, in the Korean Intellectual Property Office, the entire disclosure of which is incorporated herein by reference for all purposes.

BACKGROUND

1. Field of the Invention

One or more example embodiments relate to a substrate cleaning line and a substrate cleaning system including the same.

2. Description of the Related Art

In general, semiconductors are manufactured by iteratively performing a series of processes such as lithography, deposition, and etching. Contaminants such as various particles, metal impurities, or organic materials remain on a surface of a substrate of a semiconductor due to the iterative processes. Due to such contaminants on the substrate, the semiconductor may be less reliable. To remove the contaminants, a process of cleaning and drying a substrate, that is, a substrate treatment process in a semiconductor manufacturing process is required.

Meanwhile, the substrate treatment process requires a process of loading, unloading, or transferring a substrate from or to a plurality of treatment chambers, and such processes consume a tremendous amount of time in a semiconductor manufacturing process. Accordingly, there is a demand for a substrate treatment line having a parallel structure to clean or dry a plurality of substrates simultaneously.

The above description is information the inventor(s) acquired during the course of conceiving the present disclosure, or already possessed at the time, and is not necessarily art publicly known before the present application was filed.

SUMMARY

Example embodiments provide a substrate cleaning line and a substrate cleaning system including the same to flexibly manage processes by modifying a transfer order of a chamber.

Example embodiments provide a substrate cleaning line and a substrate cleaning system including the same to provide an efficient path for a substrate.

Example embodiments provide a substrate cleaning line and a substrate cleaning system including the same for rapid cleaning of a substrate.

Example embodiments provide a substrate cleaning line and a substrate cleaning system including the same to efficiently handle a failure.

According to an aspect, there is provided a substrate cleaning line including a chamber portion comprising a plurality of cleaning chambers to clean a substrate, and a first return robot to load, unload, or transfer the substrate from or to the plurality of cleaning chambers, wherein the cleaning chambers may be stacked on each other in a vertical direction.

The chamber portion may include a first chamber portion, and a second chamber portion that is disposed at an interval with the first chamber portion in a horizontal direction.

The first return robot may be disposed between the first and second chamber portions.

The first return robot may be vertically and horizontally movable and may be rotatable on an axis perpendicular to a ground.

The first chamber portion may include a first cleaning chamber, a second cleaning chamber and a third cleaning chamber and the second chamber portion may include a fourth cleaning chamber and a fifth cleaning chamber.

The first cleaning chamber, the second cleaning chamber, and the third cleaning chamber may be sequentially stacked on each other from bottom to top and the fourth cleaning chamber and the fifth cleaning chamber may be sequentially stacked on each other from top to bottom.

The first return robot may transfer the substrate to the first cleaning chamber, the second cleaning chamber, the third cleaning chamber, the fourth cleaning chamber, and the fifth cleaning chamber, in this order.

The first return robot may transfer the substrate to the first cleaning chamber, the third cleaning chamber, the second cleaning chamber, the fourth cleaning chamber, and the fifth cleaning chamber, in this order.

According to an aspect, there is provided a substrate cleaning system including the substrate cleaning line of claim 1, and a second return robot to transfer a polished substrate to the substrate cleaning line.

The substrate cleaning line may include a first substrate cleaning line and a second substrate cleaning line wherein the first substrate cleaning line and the second substrate cleaning line may be each disposed at an interval in a horizontal direction.

The second return robot may be disposed between the first and second substrate cleaning lines.

When one of the first and second substrate cleaning lines breaks down, the second return robot may transfer a polished substrate to the other one.

The second return robot may transfer a polished substrate to any one of the cleaning chambers of the substrate cleaning line.

The substrate cleaning line further may include a transferring stage to receive a polished substrate, and the second return robot may transfer the polished substrate to the transferring stage.

The transferring stage may be disposed between two adjacent cleaning chambers among the plurality of cleaning chambers.

Additional aspects of example embodiments will be set forth in part in the description which follows and, in part, will be apparent from the description, or may be learned by practice of the disclosure.

According to example embodiments, processes may be flexibly managed by modifying a transfer order of a chamber.

According to example embodiments, a substrate cleaning line and a substrate cleaning system including the same may efficiently clean a substrate.

According to example embodiments, a substrate cleaning line and a substrate cleaning system including the same may efficiently handle a failure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
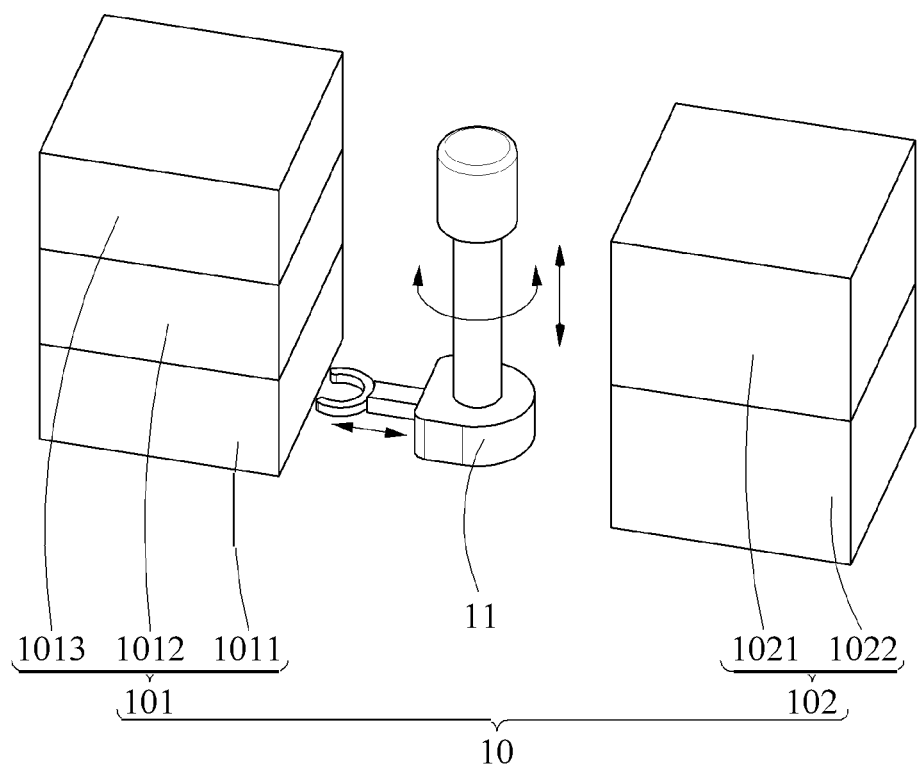
FIG. 1 is a schematic perspective view of a substrate cleaning line according to an example embodiment.
Figure 1:
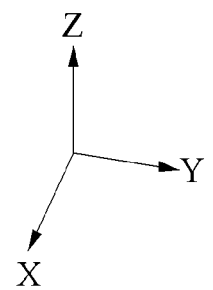

Hereinafter, example embodiments will be described in detail with reference to the accompanying drawings. However, various alterations and modifications may be made to the example embodiments. Here, the example embodiments are not construed as limited to the disclosure. Here, the example embodiments are not construed as limited to the disclosure and should be understood to include all changes, equivalents, and replacements within the idea and the technical scope of the disclosure.

The terminology used herein is for the purpose of describing particular example embodiments only and is not to be limiting of the example embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

Also, in the description of the components, terms such as first, second, A, B, (a), (b) or the like may be used herein when describing components of the present disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements.

The same name may be used to describe an element included in the example embodiments described above and an element having a common function. Unless otherwise mentioned, the descriptions on the example embodiments may be applicable to the following example embodiments and thus, duplicated descriptions will be omitted for conciseness.

FIG. 1 is a schematic perspective view of a substrate cleaning line 1 according to an example embodiment.

Referring to FIG. 1, the substrate cleaning line 1 may be used in a substrate cleaning process to clean a polished substrate. The substrate cleaning line 1 may include a chamber portion 10 and a first return robot 11.

A substrate (not shown) may be a silicon wafer for a semiconductor substrate. However, the type of the substrate is not limited to the foregoing example. The substrate may include, for example, glass for a liquid crystal display (LCD), a plasma display panel (PDP), and a flat panel display (FPD). In addition, the substrate W is not limited to a particular shape or size. The substrate W may be substantially any shape and size. For example, the substrate W may be a circle and a squared plate.

The chamber portion 10 may provide a space in which a cleaning process for a substrate is performed. A substrate cleaning process may include a substrate cleaning process and a substrate drying process. A plurality of the chamber portions 10 may be provided. For example, the chamber portion 10 may include a first chamber portion 101 and a second chamber portion 102 which is disposed at an interval with the first chamber portion 101 in a horizontal direction. However, this is an example, and a number of the chamber portions 10 is not limited thereto.

The chamber portion 10 may include a cleaning chamber to clean a substrate. A nozzle, in which a cleaning solution to clean a substrate is provided, may be included inside of the cleaning chamber. A plurality of the cleaning chambers may be provided. For example, the chamber portion 10 may include a first to fifth cleaning chambers 1011, 1012, 1013, 1021, and 1022. In addition, the first to fifth cleaning chambers 1011, 1012, 1013, 1021, and 1022 may include nozzles respectively in which different cleaning solutions are provided. The first chamber portion 101 may include the first to third cleaning chambers 1011, 1012, and 1013 and the second chamber portion 102 may include the fourth and fifth cleaning chambers 1021 and 1022. However, this is an example, and a number and disposition of the chambers are not limited thereto. A plurality of the cleaning chambers may be stacked on each other in a vertical direction. For example, the first to third cleaning chambers 1011, 1012, and 1013 of the first chamber portion 101 may be sequentially stacked from bottom to top (for example, in a +z axis direction) based on a ground. In addition, the fourth and fifth cleaning chambers 1021 and 1022 may be sequentially stacked from top to bottom (for example, in a −z axis direction) based on the ground.

A first return robot 11 may load, unload, or transfer a substrate from or to the plurality of cleaning chambers. The first return robot 11 may support a bottom surface of a substrate. For example, the first return robot 11 may include a gripping portion for gripping a substrate to stably transfer the substrate. The first return robot 11 may be disposed between the first and second chamber portions 101 and 102. For example, the first chamber portion 101, the first return robot 11, and the second chamber portion 102 may be rectilinearly disposed. However, this is an example, and the disposition of the chamber portion 10 and the first return robot 11 is not limited thereto. For example, when a plurality of the chamber portions 10 is provided, the plurality of chamber portions 10 may each be disposed at an interval along a circumferential direction of the first return robot 11.

The first return robot 11 may move vertically and horizontally and may rotate on an axis perpendicular to the ground. Thus, the first return robot 11 may freely approach the cleaning chambers that are vertically stacked on each other and may freely approach the first chamber portion 101 and the second chamber portions 102 that are each disposed at an interval, horizontal to each other.

Figure 2A:
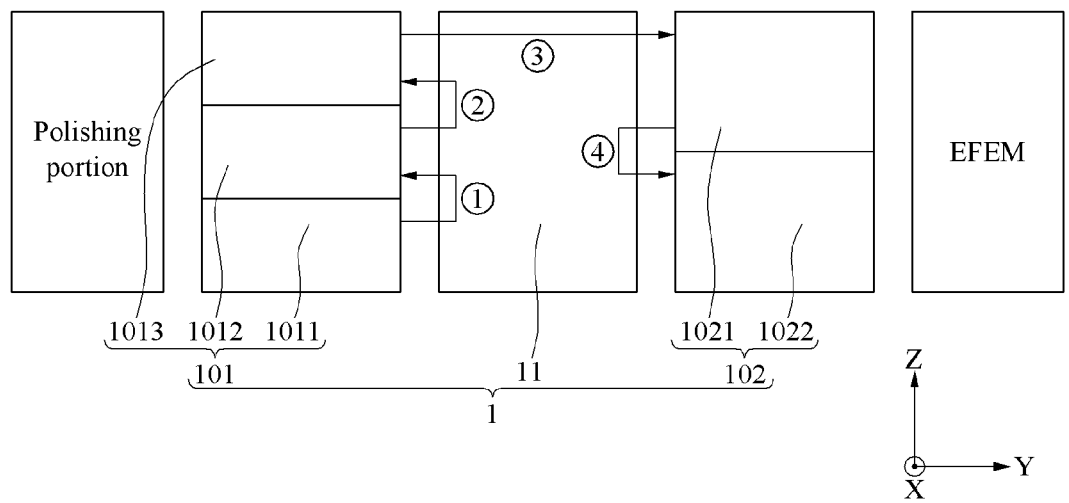
FIG. 2a is a schematic side view of a substrate cleaning line to illustrate a process of cleaning a substrate according to an example embodiment.
Figure 2B:
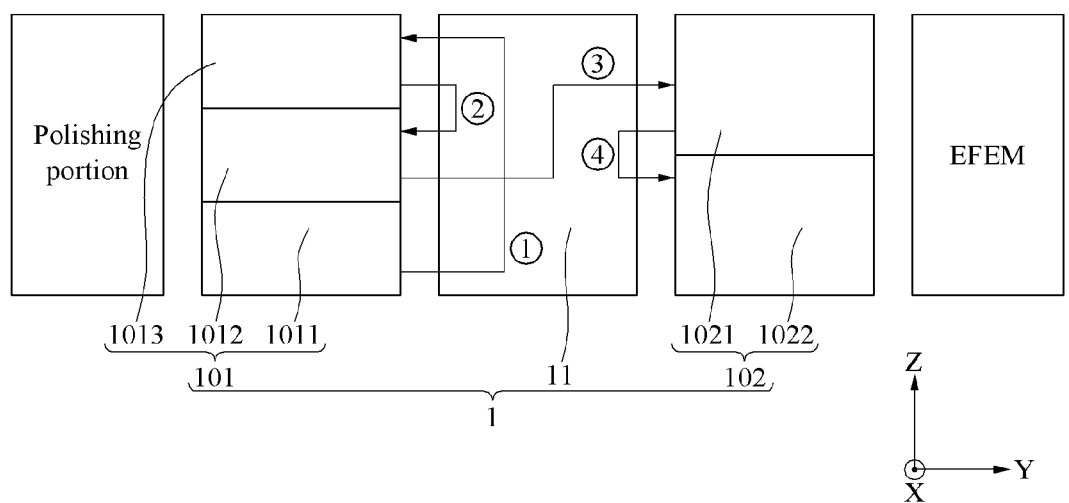
FIG. 2b is a schematic side view of a substrate cleaning line to illustrate a process of cleaning a substrate according to an example embodiment.

FIG. 2a is a schematic side view of the substrate cleaning line 1 to illustrate a process of cleaning a substrate according to an example embodiment and, FIG. 2b is a schematic side view of the substrate cleaning line 1 to illustrate a process of cleaning a substrate according to an example embodiment.

Referring to FIG. 2a and FIG. 2b, the substrate cleaning line 1 may clean substrates in a plurality of the chamber portions 10 using the first return robot 11.

The cleaning chamber may include a door (not shown) on at least one side for a substrate to enter or exit. The return robot 11 may load a substrate to at least one of the first to fifth cleaning chambers 1011, 1012, 1013, 1021, and 1022. In addition, the first return robot 11 may wait while the substrate is cleaned in the cleaning chamber. In addition, the first return robot 11 may unload the substrate when cleaning of the substrate is completed in the cleaning chamber and may transfer the substrate to at least one of the first to fifth cleaning chambers 1011, 1012, 1013, 1021, and 1022. For example, as shown in FIG. 2A, the first return robot 11 may transfer a substrate in an order of the first cleaning chamber 1011, the second cleaning chamber 1012, the third cleaning chamber 1013, the fourth cleaning chamber 1021, and the fifth cleaning chamber 1022. In addition, as shown in FIG. 2B, the first return robot 11 may transfer a substrate in an order of the first cleaning chamber 1011, the third cleaning chamber 1013, the second cleaning chamber 1012, the fourth cleaning chamber 1021, and the fifth cleaning chamber 1022. Thus, when changing an order of cleaning solutions that are exposed to a substrate according to a cleaning process, the cleaning process may proceed by a transfer path of the substrate being changed without positions of the cleaning solutions or the cleaning chambers being changed. However, the examples of FIGS. 2A and 2B are not limited thereto. For example, the order in which the first return robot 11 may pass through the plurality of cleaning chambers may vary. However, positions of a cleaning chamber in which a cleaning process begins and a cleaning chamber in which a cleaning process ends may be fixed. For example, the cleaning process may begin in the first cleaning chamber 1011 and may end in the fifth cleaning chamber 1022.

Figure 3:
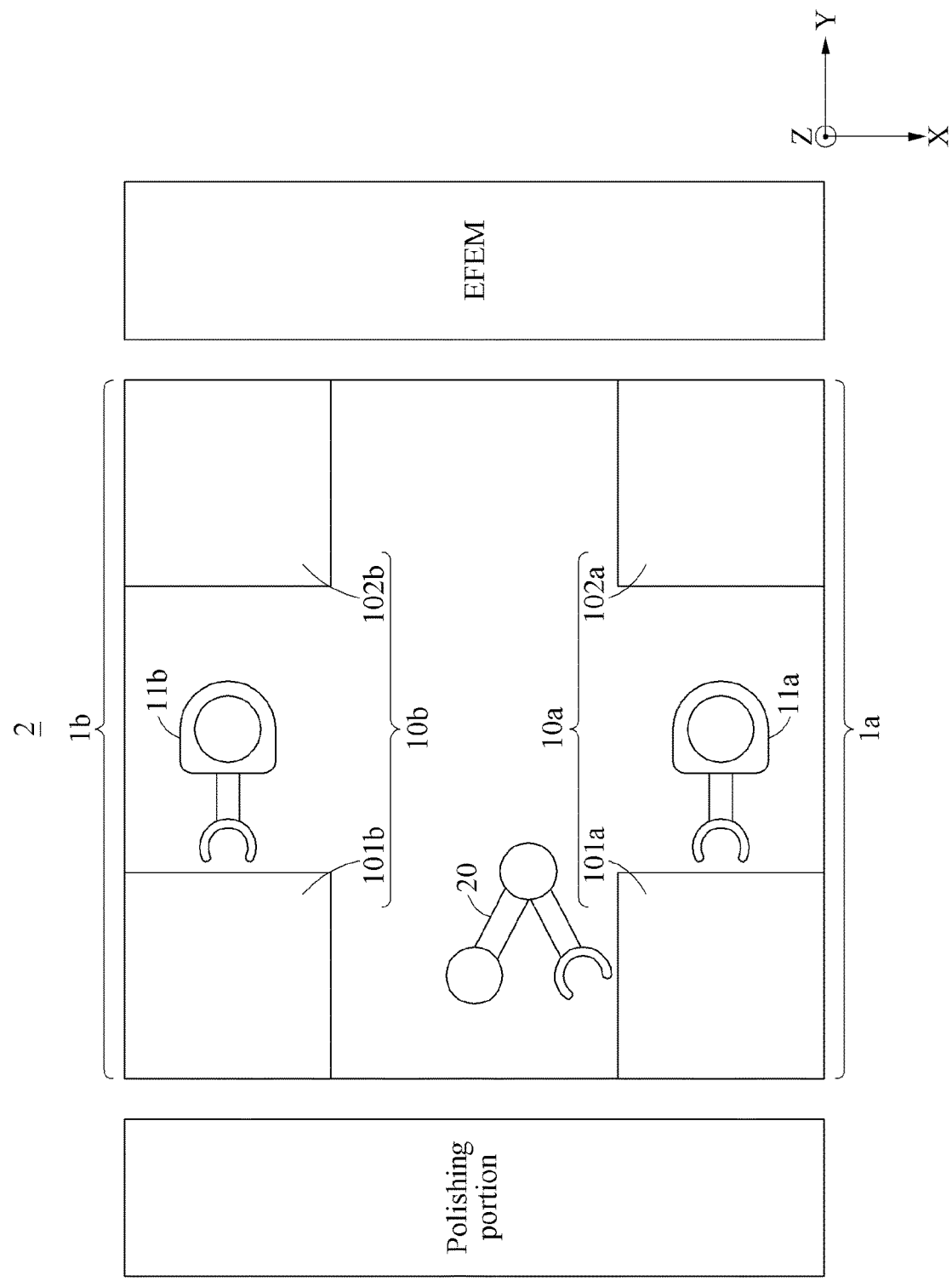
FIG. 3 is a schematic plan view of a substrate cleaning system according to an example embodiment.

FIG. 3 is a schematic plan view of a substrate cleaning system 2 according to an example embodiment.

Referring to FIG. 3, the substrate cleaning system 2 may be used in a substrate cleaning process to clean a polished substrate. The substrate cleaning system 2 may include a substrate cleaning line (for example, the substrate cleaning line 1 of FIG. 1) and a second return robot 20.

A plurality of the substrate cleaning lines 1 may be provided. For example, the substrate cleaning line 1 may include a first substrate cleaning line 1a and a second substrate cleaning line 1b. The first substrate cleaning line 1a and the second substrate cleaning line 2b may each be disposed at an interval in a horizontal direction based on the ground. For example, the first substrate cleaning line 1a and the second substrate cleaning line 1b may be disposed in parallel. Since the first substrate cleaning line 1a and the second substrate cleaning line 1b are substantially the same as the substrate cleaning line 1 described with FIGS. 1, 2A and 2B, details thereof have been omitted.

The second return robot 20 may transfer a substrate that is polished in a polishing portion to the substrate cleaning line 1. The second return robot 20 may support a bottom surface of a substrate. For example, the second return robot 20 may include a gripping portion for gripping a substrate to stably transfer the substrate. The second return robot 20 may be disposed between the first and second substrate cleaning lines 1a and 1b. The second return robot 20 may include an arm that is rotatable or extendable to approach both the first and second substrate cleaning lines 1a and 1b. The second return robot 20 may transfer the substrate that is polished in the polishing portion to one of the first substrate cleaning line 1a and the second substrate cleaning line 1b. When one of the first and second substrate cleaning lines 1a and 1b breaks down, the second return robot 20 may transfer a polished substrate to the other one that is not broken. For example, when the first substrate cleaning line 1a breaks down, the second return robot 20 may transfer a substrate that is polished in the polishing portion only to the second substrate cleaning line 1b. When the cleaning process is completed, the first or second return robots 11 and 20 may transfer a cleaned substrate to an equipment front end module (EFEM).

Figure 4A:
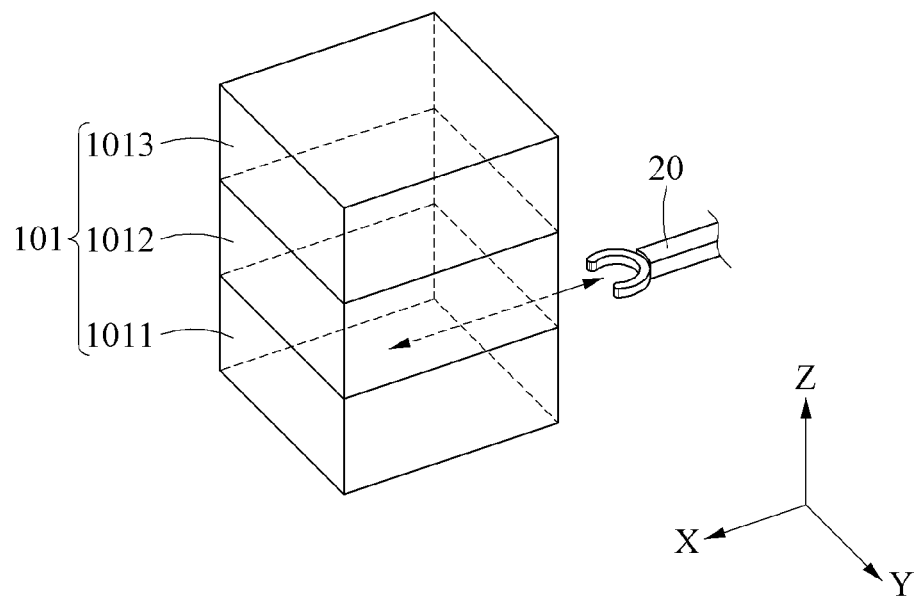
FIG. 4a is a schematic view of a first chamber portion and a second return robot according to an example embodiment.
Figure 4B:
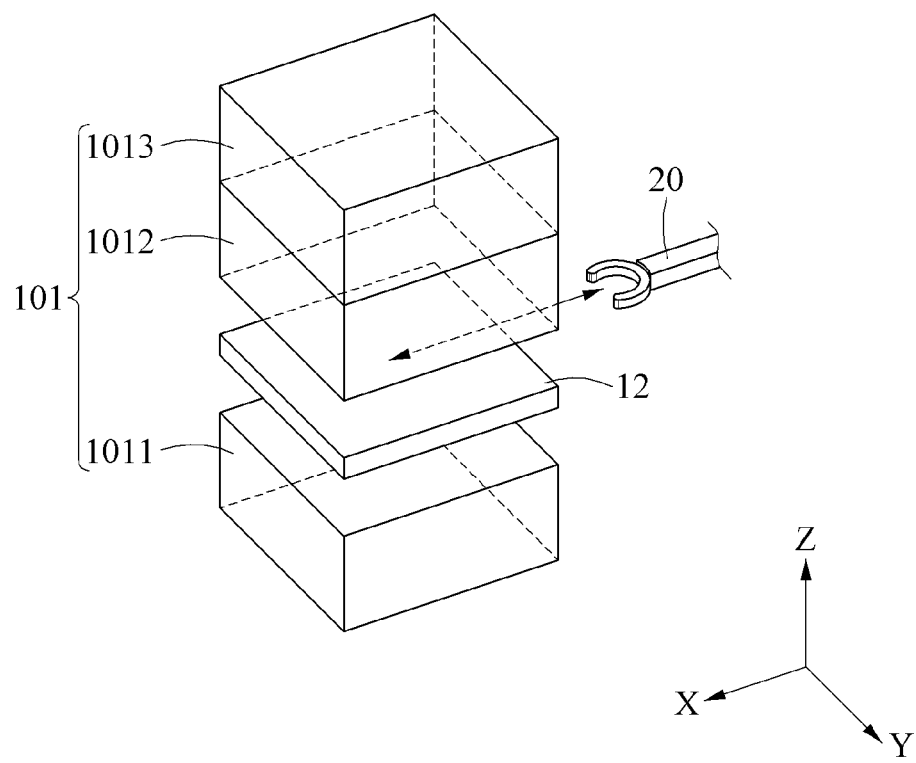
FIG. 4b is a schematic view of a first chamber portion and a second return robot according to an example embodiment.

FIG. 4a is a schematic view of a first chamber portion and a second return robot according to an example embodiment, and FIG. 4b is a schematic view of a first chamber portion and a second return robot according to an example embodiment.

Referring to FIG. 4a and FIG. 4b, the first chamber portion 101 may receive a polished substrate from the second return robot 20.

The second return robot 20 may transfer a polished substrate polished in the polishing portion to one of the cleaning chambers of the substrate cleaning line 1. For example, referring to FIG. 4A, the second return robot 20 may transfer a polished substrate polished in the polishing portion to the first cleaning chamber 1011 of the first chamber portion 101. However, the example of FIG. 4A is only for ease of understanding and a position to receive a substrate from the second return robot 20 is not limited to the first cleaning chamber 1011.

The substrate cleaning line 1 may further include a transferring stage 12. The second return robot 20 may transfer the polished substrate from the polishing portion to the transferring stage 12. The transferring stage 12 may be placed adjacent to the cleaning chamber. In addition, the transferring stage 12 may be placed between two adjacent cleaning chambers among the plurality of cleaning chambers. For example, referring to FIG. 4B, the transferring stage 12 may be placed between the first and second cleaning chambers 1011 and 1012. However, the example of FIG. 4B is only for ease of understanding and a position of the transferring stage 12 is not limited to the position between the first and second cleaning chambers 1011 and 1012. For example, the transferring stage 12 may be placed on a bottom side of the first cleaning chamber 1011. When the second return robot 20 transfers the polished substrate to the transferring stage 12, the first return robot 11 may transfer the substrate transferred to the transferring stage 12 to one of the cleaning chambers.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A substrate cleaning system comprising:
   a first substrate cleaning line and a second substrate cleaning line, wherein the first substrate cleaning line and the second substrate cleaning line are each disposed at an interval in a horizontal direction; and
   a second return robot disposed between the first substrate cleaning line and the second substrate cleaning line to transfer a polished substrate to the first substrate cleaning line or the second substrate cleaning line, the second return robot comprising an arm extendable to approach both the first substrate cleaning line and the second substrate cleaning line,
   wherein each of the first substrate cleaning line and the second substrate cleaning line comprises:
      a chamber portion comprising a plurality of cleaning chambers to clean a substrate; and
      a first return robot to load, unload, or transfer the substrate from or to the plurality of cleaning chambers,
   wherein the cleaning chambers are stacked on each other in a vertical direction,
   wherein the chamber portion comprises a first chamber portion and a second chamber portion that is disposed at an interval with the first chamber portion in the horizontal direction,
   wherein the first return robot is disposed between the first chamber portion and the second chamber portion,
   wherein each of the first substrate cleaning line and the second substrate cleaning line further comprises a transferring stage to receive a polished substrate and the second return robot transfers the polished substrate to the transferring stage,
   wherein each transferring stage is stacked with the plurality of cleaning chambers in a vertical direction and arranged directly below and/or directly above one of the plurality of cleaning chambers.

2. The substrate cleaning system of claim 1, wherein the first return robot is vertically and horizontally movable and is rotatable on an axis perpendicular to a ground.

3. The substrate cleaning system of claim 1, wherein the first chamber portion comprises a first cleaning chamber, a second cleaning chamber and a third cleaning chamber and the second chamber portion comprises a fourth cleaning chamber and a fifth cleaning chamber.

4. The substrate cleaning system of claim 3, wherein the first cleaning chamber, the second cleaning chamber, and the third cleaning chamber are sequentially stacked on each other from bottom to top and the fourth cleaning chamber and the fifth cleaning chamber are sequentially stacked on each other from top to bottom.

5. The substrate cleaning system of claim 4, wherein the first return robot transfers the substrate to the first cleaning chamber, the second cleaning chamber, the third cleaning chamber, the fourth cleaning chamber, and the fifth cleaning chamber, in this order.

6. The substrate cleaning system of claim 4, wherein the first return robot transfers the substrate to the first cleaning chamber, the third cleaning chamber, the second cleaning chamber, the fourth cleaning chamber, and the fifth cleaning chamber, in this order.

7. The substrate cleaning system of claim 1, wherein the substrate cleaning system is configured to handle a failure via:
   responsive to the first substrate cleaning line breaking down, the second return robot transfers a polished substrate only to the second substrate cleaning line and not to the first substrate cleaning line, and
   responsive to the second substrate cleaning line breaking down, the second return robot transfers a polished substrate only to the first substrate cleaning line and not to the second substrate cleaning line.

8. The substrate cleaning system of claim 1, wherein the second return robot transfers a polished substrate to any one of the plurality of cleaning chambers of the first substrate cleaning line and the second substrate cleaning line.

9. The substrate cleaning system of claim 1, wherein each transferring stage is arranged between two vertically adjacent cleaning chambers of the plurality of cleaning chambers, directly below one of the two vertically adjacent cleaning chambers and directly above an other of the two vertically adjacent cleaning chambers.

10. The substrate cleaning system of claim 1, wherein the second return robot is configured to not transfer a polished substrate to a cleaning line that has broken down.

11. The substrate cleaning system of claim 1, wherein each of the plurality of cleaning chambers includes one of a plurality of nozzles, each of the plurality of nozzles providing a different one of a plurality of cleaning solutions.

12. The substrate cleaning system of claim 11, wherein a cleaning process is determined based on a transfer path through the plurality of cleaning chambers, the transfer path defining an order of exposure of the polished substrate to the plurality of cleaning solutions via transfer of the polished substrate through each of the plurality of cleaning chambers.

13. The substrate cleaning system of claim 12, changing the cleaning process for the polished substrate via changing the order of transfer of the polished substrate through the plurality of cleaning chambers to expose the polished substrate to a different order of the plurality of cleaning solutions without changing a position of the plurality of cleaning solutions.

* * * * *